(12) United States Patent
Mohanty et al.

(10) Patent No.: US 10,319,637 B2
(45) Date of Patent: Jun. 11, 2019

(54) METHOD FOR FULLY SELF-ALIGNED VIA FORMATION USING A DIRECTED SELF ASSEMBLY (DSA) PROCESS

(71) Applicant: Tokyo Electron Limited, Minato-ku, Tokyo (JP)

(72) Inventors: Nihar Mohanty, Clifton Park, NY (US); Elliott Franke, Albany, NY (US); Richard Farrell, Nassau, NY (US)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 15/808,473

(22) Filed: Nov. 9, 2017

(65) Prior Publication Data

US 2018/0130708 A1 May 10, 2018

Related U.S. Application Data

(60) Provisional application No. 62/419,675, filed on Nov. 9, 2016.

(51) Int. Cl.
| | |
|---|---|
| *H01L 21/311* | (2006.01) |
| *H01L 21/768* | (2006.01) |
| *H01L 23/528* | (2006.01) |
| *H01L 23/522* | (2006.01) |
| *H01L 21/02* | (2006.01) |

(52) U.S. Cl.
CPC .. *H01L 21/76897* (2013.01); *H01L 21/02118* (2013.01); *H01L 21/02318* (2013.01); *H01L 21/31111* (2013.01); *H01L 21/31133* (2013.01); *H01L 21/76802* (2013.01); *H01L 21/76828* (2013.01); *H01L 21/76834* (2013.01); *H01L 21/76877* (2013.01); *H01L 23/5226* (2013.01); *H01L 23/5283* (2013.01)

(58) Field of Classification Search
CPC .......... H01L 21/76897; H01L 23/5226; H01L 23/5283; H01L 21/02118; H01L 21/76802; H01L 21/76877
See application file for complete search history.

(56) References Cited

U.S. PATENT DOCUMENTS

2015/0093702 A1* 4/2015 Nyhus .................. G03F 7/0392
430/270.1

* cited by examiner

*Primary Examiner* — Zandra V Smith
*Assistant Examiner* — Molly K Reida (57) ABSTRACT

A formed back-end-of-line (BEOL) metal line layer may include a plurality of metal lines with dielectric oxide caps that are disposed in between each metal lines. To overlay an interconnecting layer of metal lines on a selected metal line of the BEOL metal line layer, a block copolymer (BCP) may be formed on a patterning layer. Thereafter, a selective etching of the formed BCP creates a recess above the selected metal line. The created recess facilitates the overlaying of the interconnecting layer of metal lines.

21 Claims, 7 Drawing Sheets

FIG. 6
(Continuation)

METHOD FOR FULLY SELF-ALIGNED VIA FORMATION USING A DIRECTED SELF ASSEMBLY (DSA) PROCESS

BACKGROUND

Fabricating semiconductor devices includes patterning a wafer surface to be able to create various trenches, holes, and openings in underlying layers. Currently, there are challenges with using lithographic tools to create patterns having critical dimensions to meet design specifications. Due to the resolution limitations of patterning photoresists, patterns developed from photoresists do not have lines, trenches, and holes that are sufficiently small to meet design specifications.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein is a technology related to a method for fully self-aligned via formation using a directed self assembly (DSA). DSA is a block copolymer process that uses a manufactured polymer that consists of two blocks that are connected. With proper activation, the two (or more) block copolymers will micro phase separate into individual blocks. Conceptually this is similar to how oil can be attached to water via soap. Typically oil and water do not mix but can be held together with certain chemicals, but with these binding chemicals removed or deactivated, oil and water will separate. Likewise, two different blocks in a block copolymer mixture will repel each other, while other blocks can be attracted to themselves. Activation is typically executed via heat energy which causes block copolymer separation on a nanoscale based on various polymer parameters. This phase separation causes nanometer-sized structures to be formed. Typically, this is an alternating or repeating pattern of structures being formed. For example, alternating lines of block copolymer can be formed or assembled. Also, one block copolymer can form cylinders while the second block copolymer forms around the cylinders. Using DSA, cylinder structures can be created based on Kai the Flory interaction parameter and N—the statistical molecular weight and the volume. When DSA is coupled with a photoresist pattern (or other pattern) sub-resolution structures can be formed. This is possible because multiple lines or cylinders can be formed within feature dimensions defined by a photoresist pattern. Accordingly, patterned dimensions provided by a photoresist pattern can be shrunk to various design specifications.

Pitch scaling of Back End of Line (BEOL) metal lines continues to drive the need for improved via overlay. The orthogonal nature of the metal levels ensure alignment in one direction, but there is need to provide alignment in the other (orthogonal) direction. As pitch and line Critical Dimension (CD) shrink, the tolerance of vias to land on only metal line reduces. If overlay is not achieved, there may be shorts in the circuit. The semiconductor industry continues to search for a solution.

Techniques herein increase the overlay budget of via placement. Techniques herein use directed self-assembly (DSA) of block copolymers to solve the challenging Back End of Line (BEOL) issue of via overlay. DSA processing is used to block undesired material exposed by via patterning, ensuring a fully self-aligned via (FSV) on the metal runners.

Using phase separating DSA materials ensures via self-alignment. This approach leverages the capability of DSA to orient on different materials to produce to enhance via overlay. A wide range of DSA materials and processes can be used.

For example, a formed back-end-of-line (BEOL) metal line layer on a semiconductor substrate may include a plurality of metal lines and dielectric oxide caps, which are disposed in between each metal line of the plurality of metal lines. To overlay or join an interconnecting layer of metal lines on selected metal lines of the BEOL metal line layer, a guide pattern may be initially formed on the BEOL metal line layer. The formed guide pattern may be etched to expose a surface of the metal line and a portion of dielectric oxide caps adjacent to the surface of the metal line.

Thereafter, a block copolymer (BCP) such as a polystyrene-block-polymethyl methacrylate (PS-b-PMMA) or polystyrene-block-polydimethylsiloxane (PS-b-PDMS) system may be formed on the exposed surface of the metal line and the portion of the adjacent dielectric oxide caps. The formed BCP may be thermally annealed to graft a first type of polymer and a second type of polymer on the exposed surface of the metal line and the portion of the adjacent dielectric oxide caps, respectively.

Next, the grafted first polymer may be selectively etched to form an opening above the exposed surface of the metal line. The overlaying or joining of the interconnecting layer of metal lines may be formed by flowing interconnecting metal lines on the opening above the exposed surface of the metal line. The interconnecting metal lines may be aligned with remaining grafted second polymer to form the self-aligned via formation using the DSA.

Figure 1:
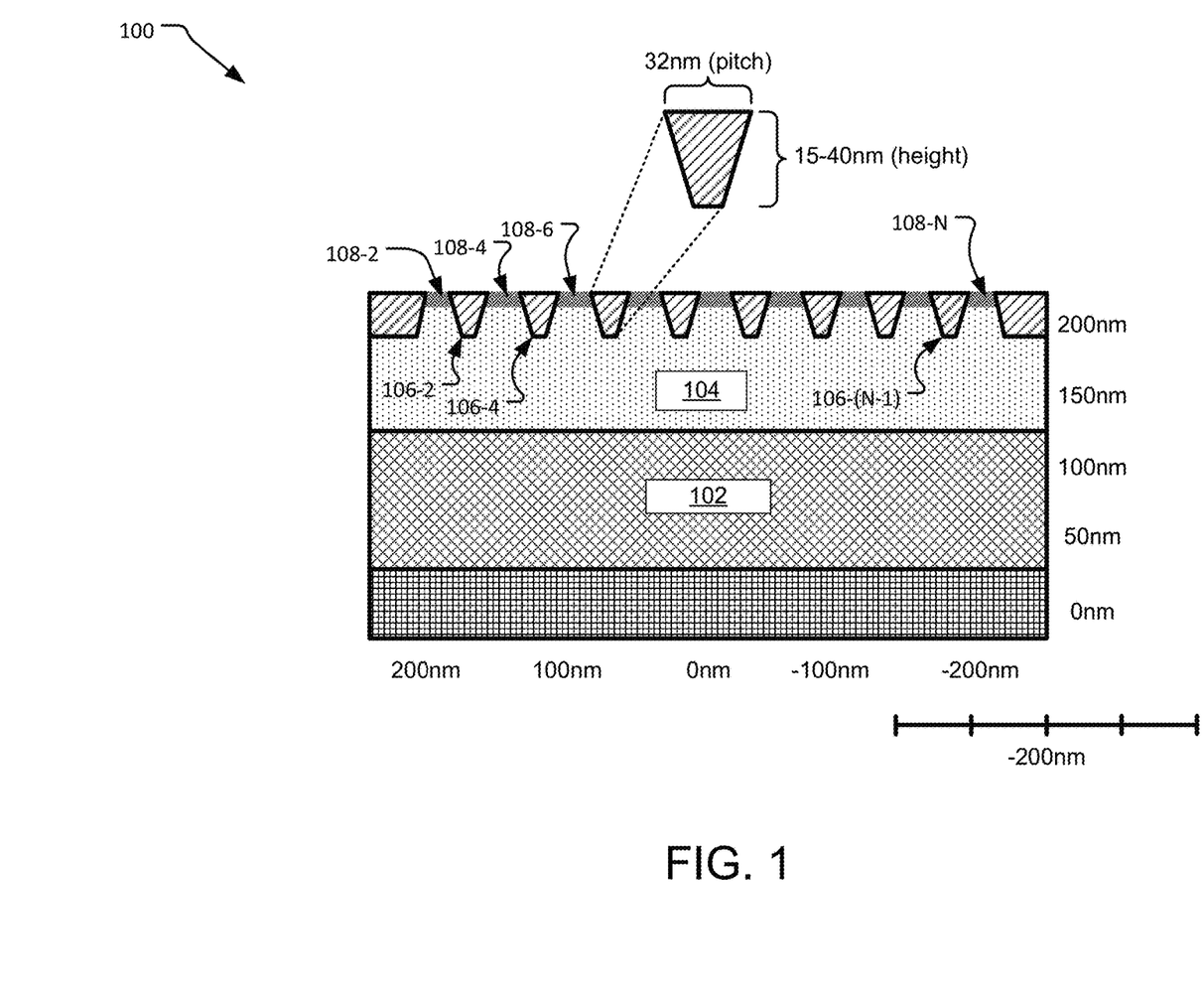
FIG. 1 illustrates a cross-sectional view of an integrated circuit (IC) device at an initial stage of a manufacturing process as described herein.

FIG. 1 illustrates a cross-sectional view of an integrated circuit (IC) device 100 at an initial stage of manufacturing. The IC device 100 may form a BEOL metal line layer that may be interconnected to another layer of metal lines.

As shown, the IC device 100 may be depicted at the initial stage of manufacturing to include a substrate 102, a low-k insulating material 104, a plurality of metal lines 106, (106-2, 106-4 . . . 106-(N−1)), and a plurality of dielectric oxide caps 108, (108-2, 108-4, 108-6 . . . 108-N). The plurality of metal lines 106-2 to 106-(N−1) (where N is an even number), for example, may facilitate an interconnection to another layer of metal lines. In this example, the interconnecting layer of metal lines be overlaid or joined with selected metal lines of the plurality of metal lines 106 on the IC device 100. As described herein, the overlaying may utilize the DSA process to reduce errors in interconnecting the other layer of metal lines to the selected metal lines of the plurality of metal lines 106.

The substrate 102 may have a variety of substrate configurations. For example, the substrate 102 may have an SOI (silicon-on-insulator) substrate configuration where semiconductor devices may be formed in and above an active layer of the SOI substrate. The substrate 102 may be made of silicon or of materials other than silicon. Thus, the terms "substrate," "semiconductor substrate" or "semiconducting substrate" may be understood to cover all semiconducting materials and all forms of such materials. The embodiments disclosed herein, however, may be disclosed in the context of forming self-aligned via formation with the use of the DSA as further discussed below.

To form the illustrated IC device 100, a masking layer (not shown) and a patterned protection layer (not shown) may be formed using traditional photolithography tools and techniques above the layers of the low-k insulating materials 104, and dielectric oxide materials of the dielectric oxide caps 108, (108-2, 108-4-108-6 . . . 108-N). Thereafter, an etching process, for example, may be performed to form trenches or a relief pattern on the formed layers of masking layer, patterned protection layer, dielectric oxide materials of the dielectric oxide caps 108, and the low-k insulating materials 104. Each formed trench, in this example, may have a sidewall that somewhat inwardly tapered. Furthermore, the formed trench may traverse the masking layer, the patterned protection layer, the dielectric oxide materials of the dielectric oxide caps 108, and up to a certain depth on the low-k insulating materials 104.

Next, flowing metallic materials such as copper or other materials at each of the trenches may be performed. The metallic materials, for example, fills up each of the trenches up to the patterned protection layer. Afterwards, a dry or wet etching process may be performed on the masking layer, the patterned protection layer, and a portion of the dielectric oxide materials to define or form the plurality of metal lines 106 with the plurality of dielectric oxide caps 108 in between each metal line of the plurality of metal lines 106. Each metal line 106 of the formed BEOL metal lines may include, for example, a pitch width of about 32 nm or less, and a depth or height of about 15-40 nm.

As described herein, surfaces of the plurality of dielectric oxide caps 108 may be coplanar with surfaces of the plurality of metal lines 106. For example, the metal line 106-2 is disposed in between dielectric oxide caps 108-2 and 108-4. In another example, the metal line 106-4 is disposed in between dielectric oxide caps 108-4 and 108-6. In these examples, the surfaces of the dielectric oxide caps 108-2 to 108-6 are coplanar with the surfaces of the metal lines 106-2 and 106-4.

The formation of the IC device 100 may not be limited to technique as described above. That is, other variety of techniques such as use of BEOL self-aligned quadruple patterning (SAQP) film stack for patterning, planarization via Chemical Mechanical Polishing (CMP), and the like, may be used as well to form the IC device 100

Figure 2:
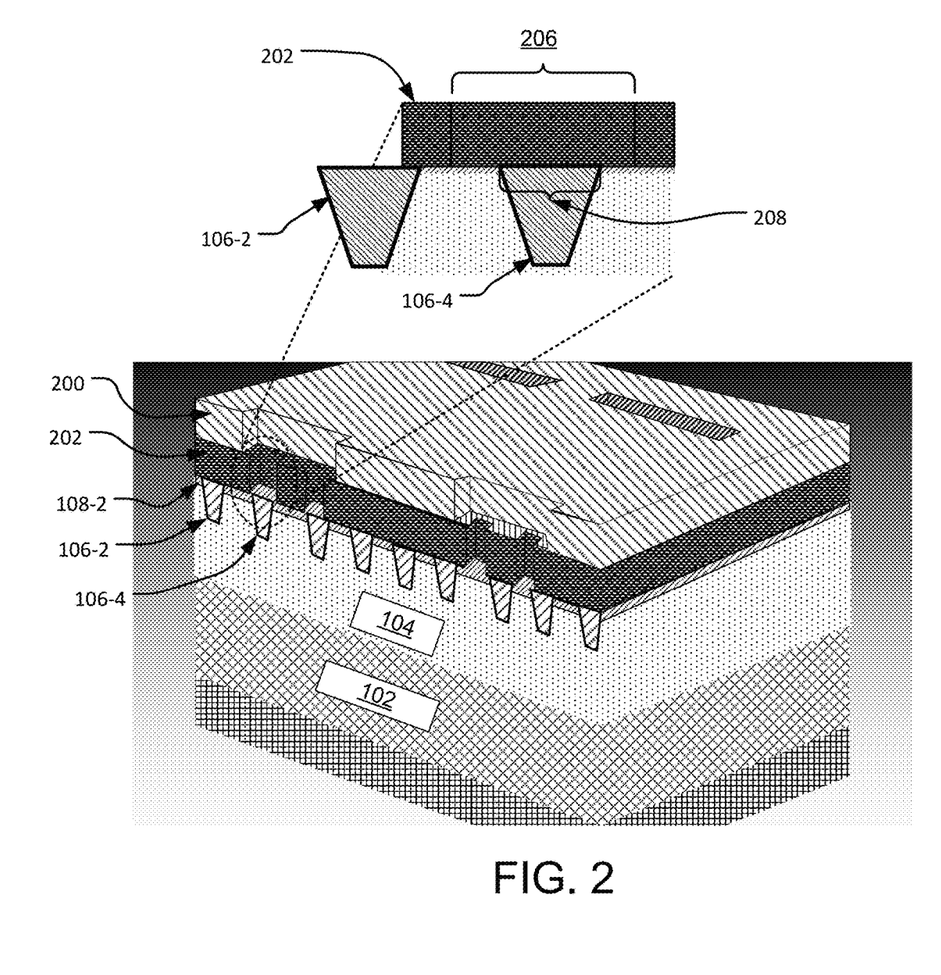
FIG. 2 illustrates an example manufacturing process stage in the formation of the self-aligned vias using the DSA as described herein.
Figure 3:
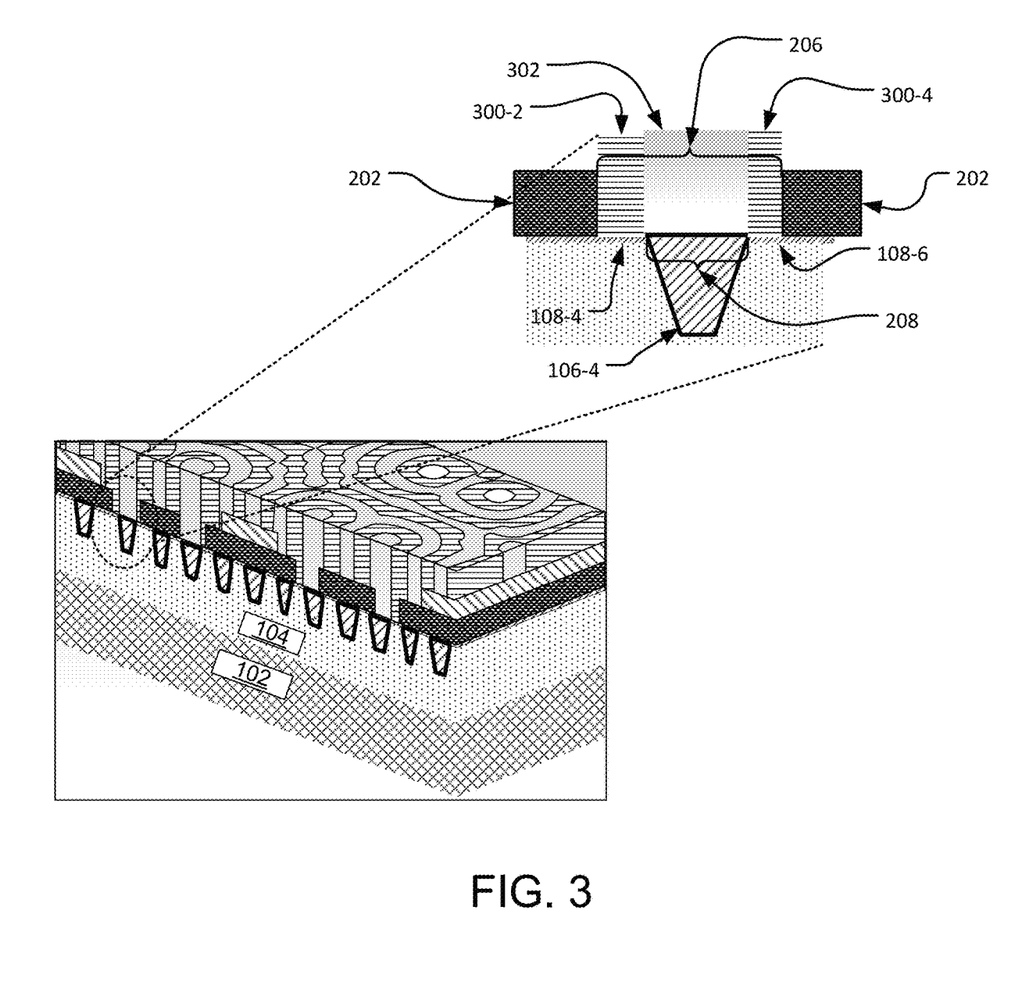
FIG. 3 illustrates another example manufacturing process stage in the formation of the self-aligned vias using the DSA as described herein.
Figure 4:
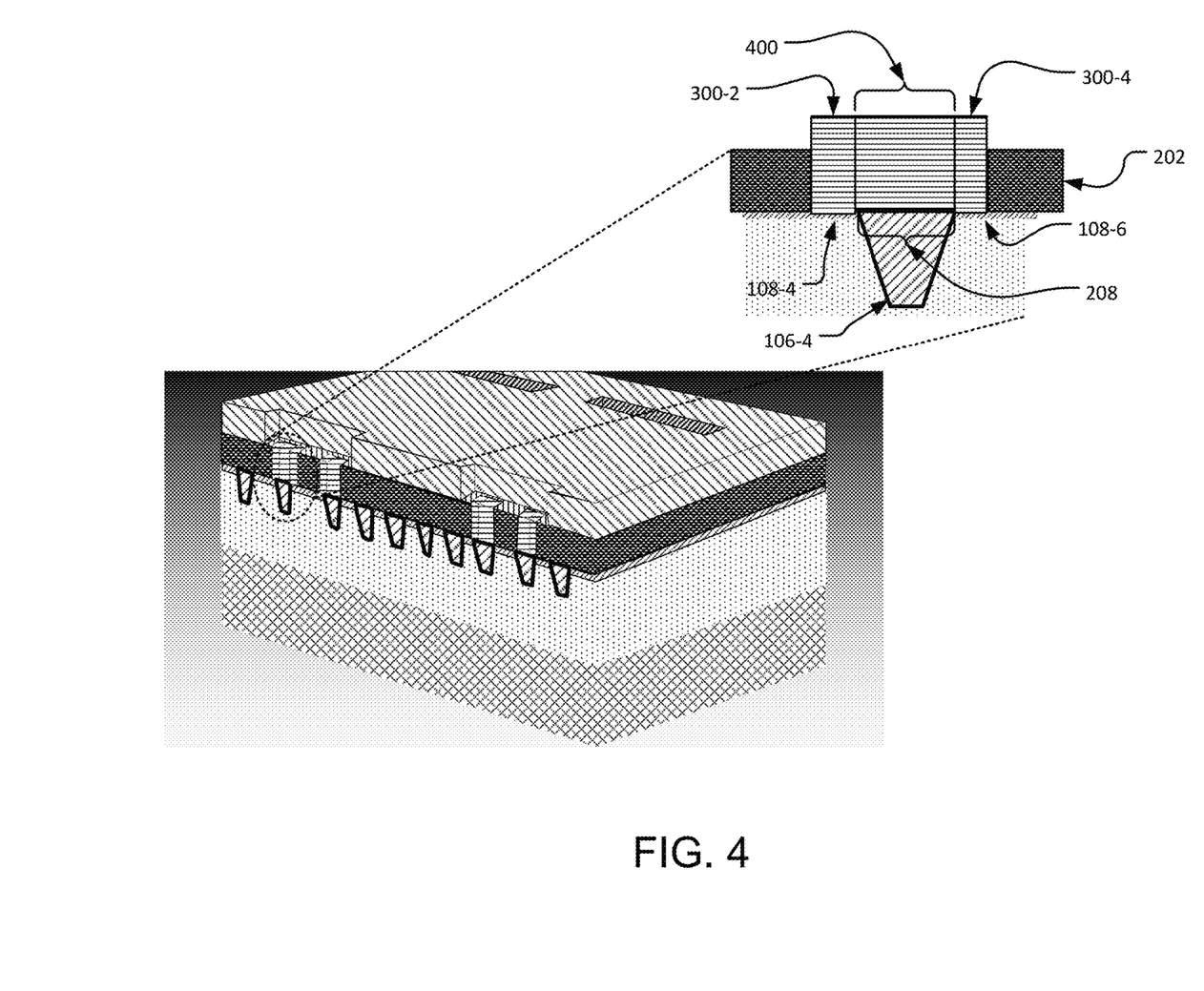
FIG. 4 illustrates another example manufacturing process stage in the formation of the self-aligned vias using the DSA as described herein

FIGS. 2-4 illustrate example steps in forming fully self-aligned vias using the DSA as described herein. The manufacturing processes illustrated in FIGS. 2-5 may be implemented on the IC device 100 of FIG. 1 in order to form the fully self-aligned vias using the DSA as described herein.

Referencing FIG. 2, a masking layer 200 and a patterned protection layer 202 (i.e., guide pattern or patterned layer) may be formed above the IC device 100 using traditional photolithography tools and techniques. For example, the patterned layer 202 may include guide pattern of insulating material that may be formed on the surface of the plurality of metal lines 106 and the dielectric oxide caps 108. In this example, the masking layer 200 may be formed on top of the patterned layer 202.

As described herein, and to pave the way for another layer of metal to lay or land on a particular metal line 106 of the plurality of metal lines 106 of IC device 100, the formed patterned layer 202 along the particular metal line 106 may be etched to have a relaxed pattern. The concept of a relaxed pattern is further discussed below.

For example, the metal line 106-4 may be selected to interconnect with the other layer of metal layer (not shown). In this example, the etching of the formed patterned layer 202 along the particular metal line 106-4 may include a first width 206 that is at least equal in size with a second width 208 of the metal line 106-4. As described herein, relaxing the pattern of the formed patterned layer 202 may include the forming of the first width 206 to be greater than the second width 208. For example, the second width 208 of the metal line 106-4 may include a width of about 32 nm or less, while the first width 206 of the patterning layer 202 may have few additional spaces (e.g., 5 nm) at each side of the second width 208. In this example, the second width 208 is considered to have a relaxed patterning.

FIG. 3 illustrates an example manufacturing process stage in the formation of the self-aligned vias using the DSA as described herein.

FIG. 3 shows a formation of a BCP where the BCP may rearrange itself into different energies after a thermal annealing process. That is, the thermal annealing may create different energies on the BCP such that a micro-separation may be generated to produce different chemical affinities e.g., different polymers. In this example, the micro-separation may line up each particular polymer according to employed energy differences on the BCP.

For example, after the annealing process, a first polymer 300, (300-2, 300-4 . . . 300-10, 300-12), may line up itself in order to get grafted into the dielectric oxide caps 108. That is, the first polymer 300 may land above the surface of the dielectric oxide caps 108 and walls of the patterned layer 202. Similarly, after the annealing process, a second polymer 302 may be formed above the metal line 106-4.

As described in FIG. 2 above, the metal line 106-4 may be selected to be interconnected to another layer of metal lines, and that the patterned layer 202 includes the first width 206 that is greater than the second width 208 of the metal line 106-4. In this regard, the formation of the first polymer 300 and the second polymer 202 may fill up the first width 206, which includes a relaxed pattern as described above.

As described herein, the formed second polymer 302 may have a width that is equal to the second width 208 i.e., grafted or fused to the exposed surface of the selected metal line 106-4. As further discussed below, the second polymer 302 may be subsequently etched in order to form a recess that may be substantially equal to the second width 208 of the selected metal line 106-4.

Other metal lines 106 in FIG. 3 that may be selected to receive the layer of interconnecting metal lines may similarly undergo the same procedure as described above. In other words, the thermal annealing may result to the second polymer 302 being grafted on the exposed surface of the selected metal line 106, and the first polymer 300 may be grafted on the surface of the corresponding adjacent dielectric oxide caps 108.

FIG. 4 illustrates an example manufacturing process stage in the formation of the self-aligned vias using the DSA as described herein.

As described in the previous manufacturing process on FIG. 3, the thermal annealing process may form the grafted first polymer 300 and the grafted second polymer 302 onto the dielectric oxide caps 108 and the metal line 106, respectively.

Referencing FIG. 4, a DSA etching technique may be implemented in order to selectively remove the second polymer 302 from the formed BCP. For example, a composition and molecular weight of the formed first polymer 300 and second polymer 302 may be controlled during a BCP controlled polymerization. In this example, targeted or selective etching or removal of the formed polymer based on their composition and molecular weight may be similarly implemented. In this regard, the second polymer 302 may be targeted for removal from the formed BCP in order to generate a recess with a third width 400 that may substantially the same or equal in length to the second width 208.

The formed recess that includes the third width 400 may pave the way for the overlaying or joining of the interconnecting layer of metal lines as described herein.

Figure 5:
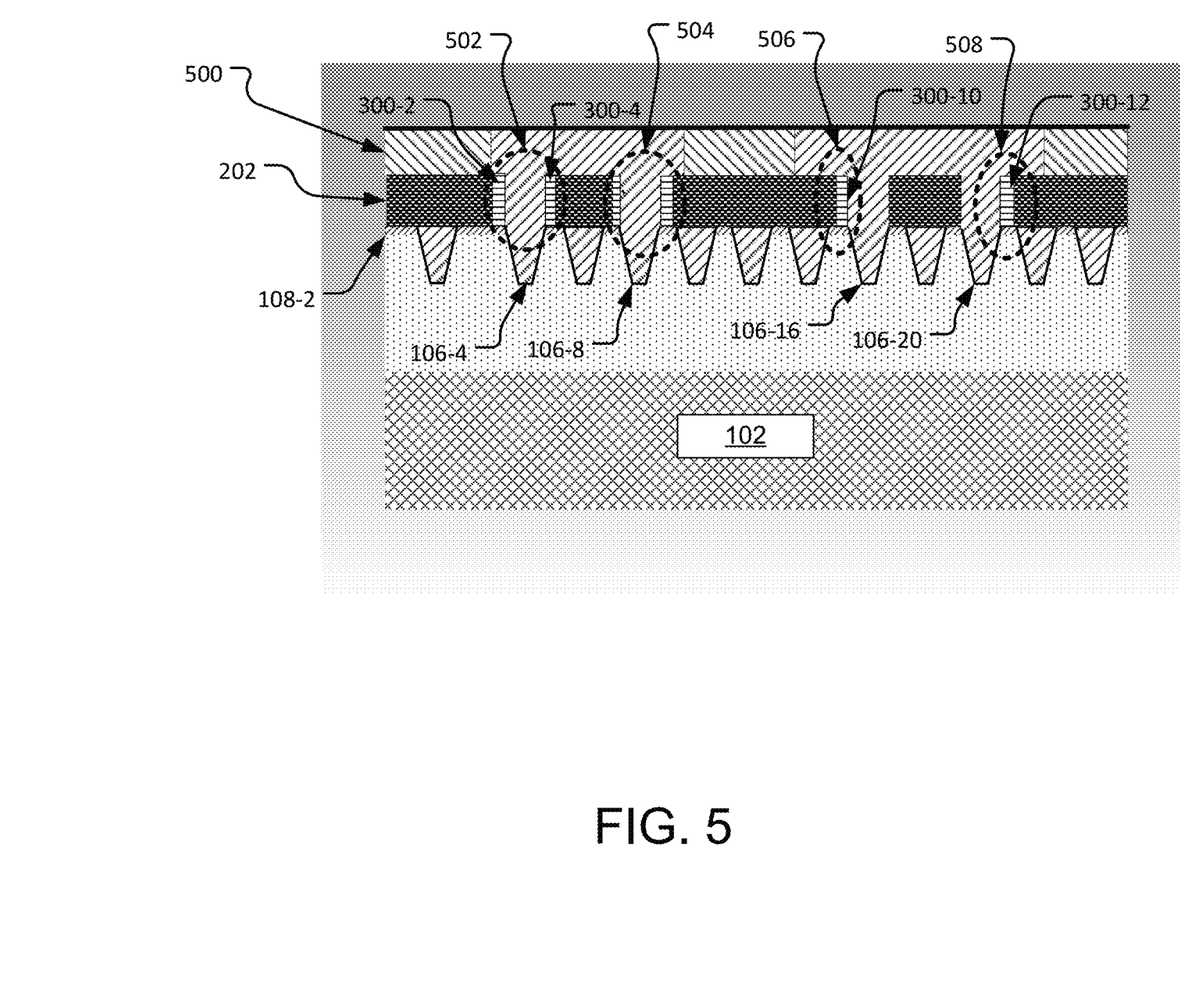
FIG. 5 illustrates an example semiconductor device with self-aligned vias as described herein

FIG. 5 illustrates an example semiconductor device with self-aligned vias as described herein.

As shown, an interconnecting layer of metal lines 500 may be formed to interconnect on the selected metal lines 106 according to a desired circuit design. For example, the layer of metal lines 500 may be formed to interconnect with the selected metal lines 106-4, 106-8, 106-16 and 106-20. In this example, each second polymer 302 that were initially formed above the exposed surfaces of the metal lines 106-4, 106-8, 106-16 and 106-20 are selectively etched to pave an opening for the interconnecting layer of metal lines 500.

With the formed recesses above the exposed surfaces of the metal lines 106-4, 106-8, 106-16 and 106-20, the interconnecting layer of metal lines 500 may be formed to fill up the formed recesses as demonstrated by interconnecting metal line—formations 502, 504, 506 to 508, respectively.

For example, the interconnecting metal lines—formation 502 shows the exposed surface of the metal line 106-4 to connect with the interconnecting metal lines 500 through the selectively etched portion, which previously includes the space covered by the grafted second polymer 302. In this example, the interconnecting metal lines 500 that lay on the exposed surface of the metal line 106-4 may align with walls of the first polymers 300-2 and 300-4.

Similarly, with regard to interconnecting metal line—formation 504, the space above the exposed surface of the metal layer 106-8 may be filled up by the interconnecting metal lines 500. For example, a selective etching of a second polymer formed above the metal line 106-8 may create the space above the exposed surface of the metal line 106-8. In this example, the interconnecting metal lines 500 that lay on the exposed surface of the metal line 106-8 may similarly align with walls of the corresponding grafted first polymers.

For the interconnecting metal line—formations 506 and 508, the descriptions above may similarly apply. However, and as shown, the interconnecting metal line—formations 506 and 508 merely shows presence of single first polymer 300-10, 300-12 to fill up the void left by the patterning layer 202.

Figure 6:
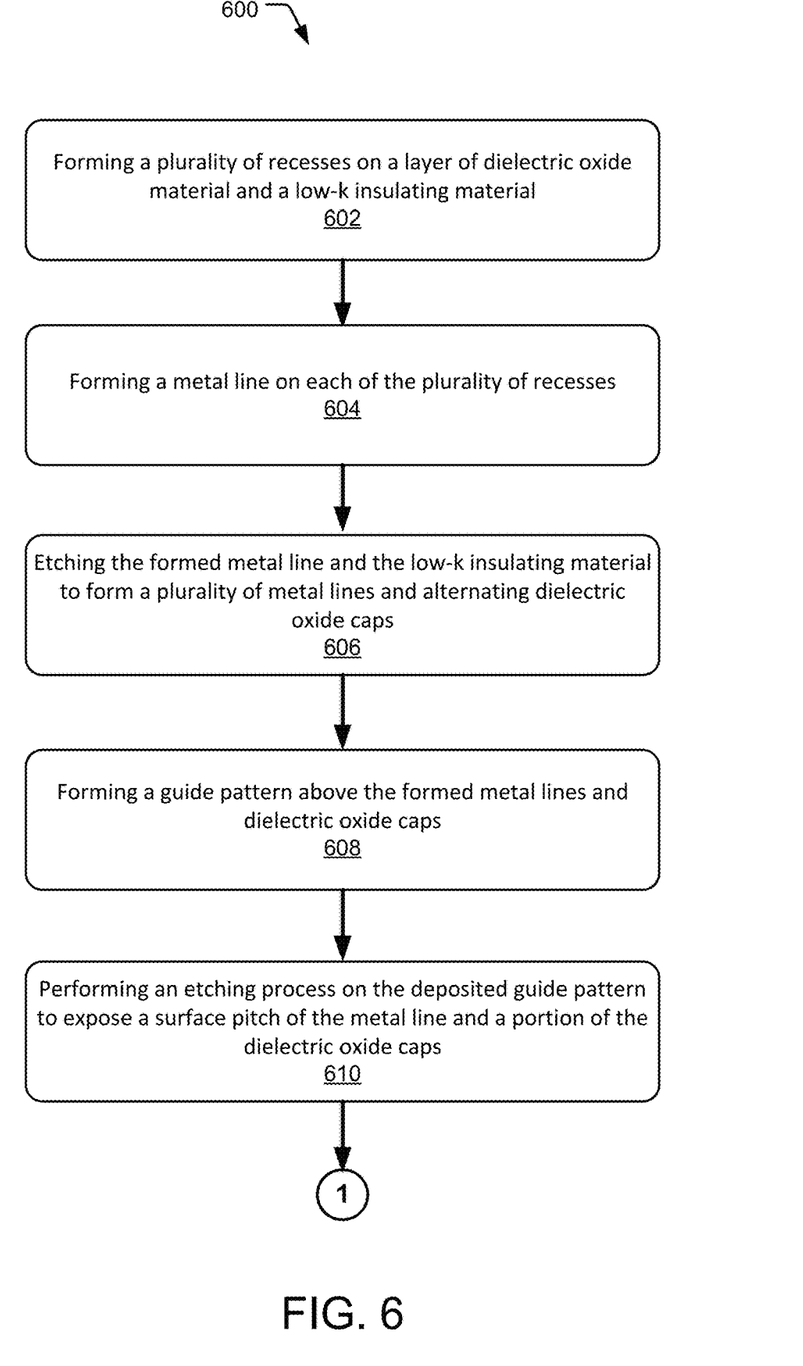
FIG. 6 illustrates an example process chart illustrating an example method for self-aligned vias using a DSA process as described herein.

FIG. 6 shows an example process chart 600 illustrating an example method for self-aligned vias using a DSA process as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 602, forming a plurality of recesses on a layer of dielectric oxide material and a low-k insulating material is performed. For example, the layer includes the low-k insulating material 104 and the dielectric oxide materials, which may be formed on or above the low-k insulating material 104. In this example, an etching process may form the plurality of recesses or trenches on the layer of the dielectric oxide material and the low-k insulating material 104. Each recess or trench, for example, may include a depth that traverses a thickness of the dielectric oxide material and a certain portion or depth of the low-k insulating material 104.

At block 604, forming a metal line on each of the plurality of recesses is performed. For example, metallic materials may be deposited on each recess of the plurality of recesses.

At block 606, etching the formed metal line and the low-k insulating material to form a plurality of metal lines and alternating dielectric oxide caps in between metal line is performed. For example, the etching process may be performed on the layer of dielectric oxide materials and the formed metal lines. In this example, the etching may facilitate formation of the plurality of metal lines 106 with the dielectric oxide caps 108 that are disposed in between each of the metal lines 106.

The processes described in blocks 602 to 606 above may form the BEOL metal line layer that may be interconnected with a second layer of metal lines as further discussed below.

At block 608, forming a guide pattern above metal lines and dielectric oxide caps is performed. In other words, depositing of the guide pattern is performed on the layer that includes an alternating dielectric oxide caps and metal lines of block 606. For example, the guide pattern insulating material (i.e., guide pattern or patterning layer 202) may be formed above the plurality of metal lines 106 dielectric and oxide caps 108. A guide pattern may be considered as a sacrificial layer. DSA processes patterns may be formed to provide physical direction to a guide self-assembly. In such implementations, the pattern on the substrate is not all sacrificial, and may include openings for metallization. A topography with additional surfaces exposed, which may be due to overlay/resolution error, may be to also provide surface energy differences to direct self-assembly without a purpose-specific guide pattern.

At block 610, an etching process on the deposited guide pattern to expose a surface of the metal line and a portion of the dielectric oxide caps adjacent to the surface of the metal line is performed. For example, the patterning layer 202 may be etched to form a recess with a width defined by the first width 208. In this example, the formed recess may expose the surface 208 of the metal line 106, and portions of the dielectric oxide caps adjacent to the surface 208 of the metal line 106.

At block 612, depositing a block copolymer (BCP) on the exposed metal line and the portion of the adjacent dielectric oxide caps is performed.

At block 614, annealing the formed BCP to graft a first and second polymers to the exposed surface of the metal line and the portion of the adjacent dielectric oxide caps, respectively, is performed. For example, the first polymer 300 may land on the dielectric oxide caps 108 while the second polymer 302 may land or get fused to the exposed surface 208 of the metal line 106.

At block 616, recessing the first polymer and the second polymer until uncovering a top surface of the guide pattern. After self-assembly, the DSA layer may be planarized or uniformly recessed to top surfaces of the dielectric layer. After this uniform etching is completed, then the etching of the grafted first polymer is executed followed by metallization. Etch processing tuning can allow for uniform etch back across a wafer to be within 1 nanometer.

At block 618, etching the first polymer that is grafted on the exposed metal line is performed. For example, a selective etching of the formed second polymer 302 on the exposed surface 208 of the metal line 106 may expose the surface of the metal line 106.

At block 620, forming an interconnecting metal line on the exposed metal line is performed. For example, a second layer of metal lines may be interconnected to the first layer of metal lines i.e., BEOL metal line layer. In an embodiment, the etching of the guide pattern forms an initial isolation of the metal lines from the second layer of metal lines are selected to interconnect with the first layer of metal lines (interconnecting layer of metal lines)

What is claimed is:

1. A method of self-aligned via formation comprising:
depositing a guide pattern layer on a first layer that includes an alternating dielectric oxide caps and metal lines;
performing an etching process on the deposited guide pattern layer to expose a surface of the metal line and a portion of dielectric oxide caps adjacent to the surface of the metal line, the performing the etching process resulting in a guide pattern;
depositing a block copolymer (BCP) on the exposed surface of the metal line and the portion of the adjacent dielectric oxide caps;
annealing the deposited BCP to graft a first polymer and a second polymer on the exposed surface of the metal line and the portion of the adjacent dielectric oxide caps, respectively;
recessing the first polymer and the second polymer until uncovering a top surface of the guide pattern, wherein the recessing the first polymer and the second polymer is executed after annealing the deposited BCP;
etching the grafted first polymer on the exposed surface of the metal line after recessing the first polymer and the second polymer; and
forming a second layer of metal lines that interconnects with the exposed surface of the metal line.

2. The method of claim 1 further comprising:
forming a plurality of recesses on a layer of dielectric oxide material and a low-k insulating material;
forming the metal line on each recess;
performing an etching process on the dielectric oxide material and the formed metal lines to form the first layer that includes the alternating dielectric oxide caps and the metal lines.

3. The method of claim 1, wherein the performing of the etching process on the guide pattern forms an initial isolation of the metal lines that are selected to interconnect with the second layer of metal lines.

4. The method of claim 1, wherein the performing of the etching process on the guide pattern forms a guide pattern recess that is greater than the exposed surface of the metal line.

5. The method of claim 4, wherein the grafted second polymer on the portion of adjacent dielectric oxide caps are aligned with walls of the formed guide pattern recess.

6. The method of claim 1, wherein the exposed surface of the metal line includes a pitch width of 32 nm or less.

7. The method of claim 1, wherein the grafted second polymer includes a type of insulating material.

8. The method of claim 1, wherein the first layer that includes the alternating dielectric oxide caps and the metal lines is a back-end-of-line (BEOL) metal line layer.

9. A device comprising:
a back-end-of-line (BEOL) metal line layer that includes alternating dielectric oxide caps and metal lines;
a guide pattern formed on the BEOL metal line layer, wherein the guide pattern is etched to expose a surface of the metal line and a portion of dielectric oxide caps adjacent to the surface of the metal line;
a block copolymer (BCP) that is formed on the exposed surface of the metal line and the portion of the adjacent dielectric oxide caps, the BCP is annealed to graft a first polymer and a second polymer on the exposed surface of the metal line and the portion of the adjacent dielectric oxide caps, respectively, wherein the grafted first polymer is selectively etched to form an opening above the exposed surface of the metal line;
an interconnecting layer of metal lines that is formed on the opening above the exposed surface of the metal line.

10. The device of claim 9, wherein a BEOL metal line layer formation includes:
forming a plurality of recesses on a layer of dielectric oxide material and a low-k insulating material;
forming the metal line on each recess; and
performing an etching process on the dielectric oxide material and the formed metal lines to form the BEOL metal line layer that includes the alternating dielectric oxide caps and the metal lines.

11. The device of claim 9, wherein the guide pattern forms an initial isolation of the metal lines that are selected to interconnect with the interconnecting layer of metal lines.

12. The device of claim 9, wherein guide pattern is etched to form a guide pattern recess that is greater than the exposed surface of the metal line.

13. The device of claim 12, wherein the grafted second polymer on the portion of adjacent dielectric oxide caps are aligned with walls of the formed guide pattern recess.

14. The device of claim 9, wherein the exposed surface of the metal line includes a pitch width of 32 nm or less.

15. The device of claim 9, wherein the grafted second polymer includes a type of insulating material.

16. The device of claim 9, wherein after the BCP annealing and before grafting of the first polymer on the exposed surface of the metal line and the portion of the adjacent dielectric oxide caps, recessing the first polymer and the second polymer until uncovering a top surface of the guide pattern.

17. A method of processing a substrate, the method comprising:
depositing a guide pattern layer on a back-end-of-line (BEOL) metal line layer that includes an alternating dielectric oxide caps and metal lines;
performing an etching process on the deposited guide pattern layer to expose a surface of the metal lines and a portion of dielectric oxide caps adjacent to the surface of the metal line of the BEOL metal line layer, the performing the etching process resulting in a guide pattern, wherein the performing of the etching process on the guide pattern forms an initial isolation of the metal lines that are selected to interconnect with an interconnecting layer of metal lines;

forming a block copolymer (BCP) on the exposed surface of the metal line and the portion of the adjacent dielectric oxide caps;

annealing the formed BCP to graft a first polymer and a second polymer on the exposed surface of the metal line and the portion of the adjacent dielectric oxide caps, respectively;

etching the grafted first polymer on the exposed surface of the metal line; and forming the interconnecting layer of metal lines that interconnects with the exposed surface of the metal line of the BEOL metal line layer.

18. The method of claim 17 further comprising:

forming a plurality of recesses on a layer of dielectric oxide material and a low-k insulating material;

forming the metal line on each recess;

performing an etching process on the dielectric oxide material and the formed metal lines to form the BEOL metal line layer that includes the alternating dielectric oxide caps and the metal lines.

19. The method of claim 17, wherein the performing of the etching process on the guide pattern forms a guide pattern recess having a greater width than the exposed surface of the metal line.

20. The method of claim 19, wherein the grafted second polymer on the portion of adjacent dielectric oxide caps are aligned with walls of the formed guide pattern recess.

21. The method of claim 17 further comprising after annealing and before etching the grafted first polymer, recessing the first polymer and the second polymer until uncovering a top surface of the guide pattern.

* * * * *